United States Patent [19]

Chen et al.

[11] Patent Number: 5,045,898
[45] Date of Patent: Sep. 3, 1991

[54] CMOS INTEGRATED CIRCUIT HAVING IMPROVED ISOLATION

[75] Inventors: Min-Liang Chen, Lower Macungie Township, Lehigh County; William T. Cochran, Lynn Township, Lehigh County; Chung W. Leung, South Whitehall Township, Lehigh County, all of Pa.

[73] Assignee: AT&T Bell Laboratories, Murray Hill, N.J.

[21] Appl. No.: 238,362

[22] Filed: Aug. 30, 1988

[51] Int. Cl.$^5$ ............................................. H01L 29/78
[52] U.S. Cl. ............................. 357/23.11; 357/23.12; 357/52
[58] Field of Search ..................... 357/23.11, 23.12, 52

[56] References Cited

U.S. PATENT DOCUMENTS

| | | |
|---|---|---|
| 4,354,307 | 10/1982 | Vinson et al. |
| 4,554,726 | 11/1985 | Hillenius et al. ........................ 29/571 |
| 4,700,212 | 10/1987 | Okazawa ........................... 357/23.11 |
| 4,755,863 | 7/1988 | Maeda et al. ........................ 357/23.11 |
| 4,889,825 | 12/1989 | Parrillo ............................ 357/23.11 |
| 4,903,107 | 2/1990 | Wei ................................. 357/23.11 |

*Primary Examiner*—Edward J. Wojciechowicz
*Attorney, Agent, or Firm*—James H. Fox

[57] ABSTRACT

A p-type tub in a CMOS integrated circuit is isolated from the adjacent n-type tub by means of a field oxide having a p-type channel stop region formed by a boron ion implant. The depth of the ion implant is selected so that the peak of the boron concentration is located immediately under the field oxide region that is subsequently grown. In addition, the implant is allowed to penetrate into the active device regions, producing a retrograde boron concentration in the n-channel region. This technique simultaneously improves device isolation and n-channel transistor punch-through characteristics, allowing the extension of CMOS technology to sub-micron device geometries.

5 Claims, 2 Drawing Sheets

CMOS INTEGRATED CIRCUIT HAVING IMPROVED ISOLATION

TECHNICAL FIELD

This invention relates to semiconductor integrated circuits having both n-channel and p-channel devices.

BACKGROUND OF THE INVENTION

A commonly used device configuration in silicon integrated circuit technology is referred to as CMOS, which is an acronym for Complementary Metal Oxide Semiconductor. This configuration obtained its name because it uses both p-channel and n-channel insulated gate field effect transistors. For best operation, the n-channel and p-channel devices should be electrically isolated from each other, and are therefore frequently formed in "tubs", which are doped regions in a silicon substrate. One method of forming the tubs is shown in U.S. Pat. No. 4,554,726, co-assigned herewith. In that technique, a photoresist is patterned to expose portions of the substrate for the n-type tubs. Phosphorus and arsenic are implanted, followed by photoresist stripping and oxidation of the n-type tub surface. Boron is then implanted for the p-type tub, and the oxide stripped. A dopant drive-in heating step is then accomplished to drive the dopants deeper into the semiconductor substrate, thereby forming the n-type and p-type tubs.

A second boron implant into the p tubs is performed; subsequent lithography then defines an opening in a masking layer at the boundary between the n and p tubs. An oxidation step follows, to form the "field oxide" regions, which isolate the n tubs from the p tubs at the surface of the substrate. The second boron implant then forms the "channel stop" region under the field oxide in the p tub, which aids in isolating the n-channel devices to be formed therein. In order to retain the second boron implant near the oxide/silicon interface, the field oxide is formed during a relatively brief oxidation process that is accomplished in steam at high pressure. Further fabrication steps to form the p-channel and n-channel field effect transistors (in the n tubs and p tubs, respectively) follow the tub formation, according to techniques well known to those skilled in the art.

While adequate for many prior art applications, the process described above could be improved in several respects, especially as device geometries shrink below 1 micron. For example, an improved channel stop for the n-channel devices formed in the p tub would be desirable. Also, greater punch-through resistance for the n-channel device would also be desirable.

SUMMARY OF THE INVENTION

We have found that improved characteristic with a CMOS structure can be obtained by using a channel stop implant of boron at a depth at least as great as the depth of the field oxide in the silicon substrate. That is, the p-type channel stop implant has an energy selected so that the peak concentration is just below the subsequently formed field oxide. We have found that both the electrical isolation of the n-channel devices, and the punch-through characteristics, may be simultaneously improved by this technique, facilitating the use of the CMOS process in sub-micron geometries.

For reasons of clarity, the elements of the devices depicted are not drawn to scale.

DETAILED DESCRIPTION

Figure 1:
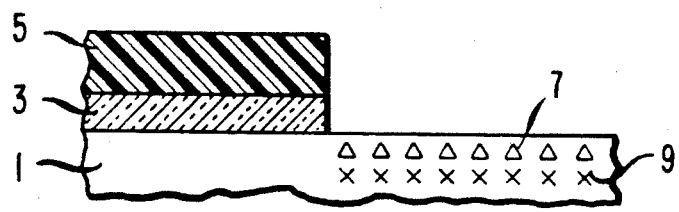
FIGS. 1-5 are sectional views of a portion of a device fabricated according to this invention.
Figure 2:
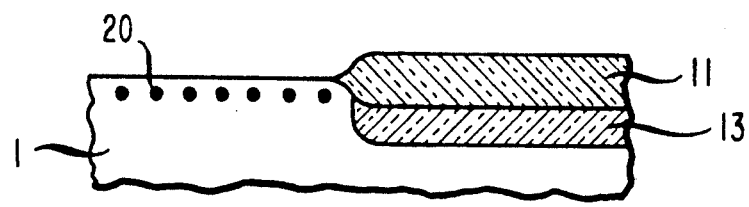
Figure 3:
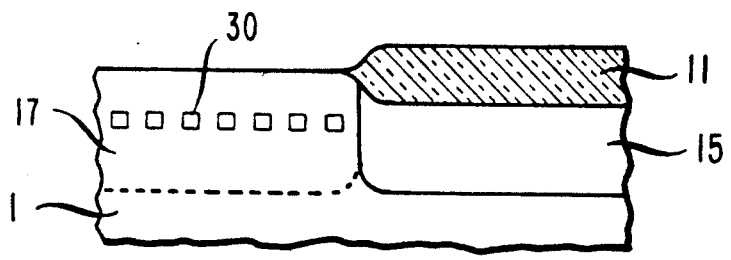
Figure 4:
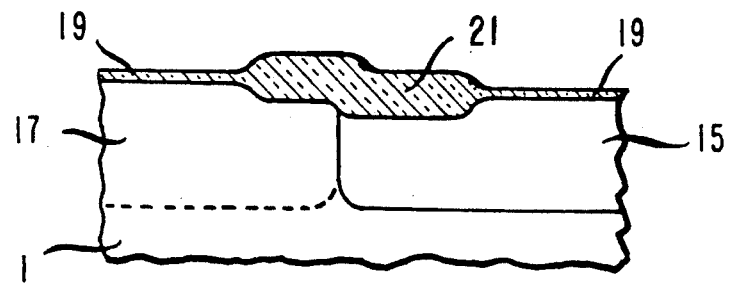

The present invention concerns an improved method of forming integrated circuits having both p channel and n channel devices. Referring to FIG. 1, a CMOS integrated circuit is shown in an early stage of fabrication. Depicted are substrate 1, oxide layer 3 and photoresist layer 5. The photoresist and oxide layers were patterned to expose selected portions of the substrate for the ion implantation for the n-type tub. Both a phosphorus implant 7 and an arsenic implant 9 have been made, as indicated by the open triangles and x's, respectively. As will be readily apparent to those skilled in the art, these steps can be readily performed by a skilled artisan without further description. The photoresist and oxide are stripped and an oxidation step for the n-type tub is performed. The oxide is shown as region 11, and the n-type region as 13. Referring to FIG. 2, a first boron implant for the p-tub is performed, shown by dots 20. This implant may be either shallow or deep. A tub drive-in step is then performed, producing the n tub 15 and the p tub 17, as shown in FIG. 3. The tub drive-in is followed by a second boron implantation, shown as open squares 30. This second boron implant is the "deep" p-type implant according to the present invention. This places the peak boron concentration as implanted at a depth in the substrate slightly greater than the depth of the subsequently-formed field oxide. Consequently, the amount of boron segregation to the field oxide during the subsequent steam oxidation is also reduced. The result is improved isolation for the n-channel devices subsequently formed in the p tub. At this point, the n-type tub oxide 11 is stripped. Active region patterning and high pressure field oxidation are performed. The resulting structure is shown in FIG. 4, with a thin oxide shown as region 19 and the field oxide shown in region 21.

In accordance with the present invention, the above-noted second, "deep" boron implant has an energy selected so that the peak of the boron profile will be located immediately underneath the field oxide, after the subsequent oxidation step. This energy also creates a retrograde p-tub boron profile in the channel region. That is, the peak concentration is below the substrate surface in the channel region. The peak should be close to the junction depth to improve punch through resistance. It will also be appreciated by those skilled in the art that the use of high pressure steam oxidation to grow the field oxide reduces the thermal cycle, and therefore creates less boron segregation into the field oxide.

Figure 5:
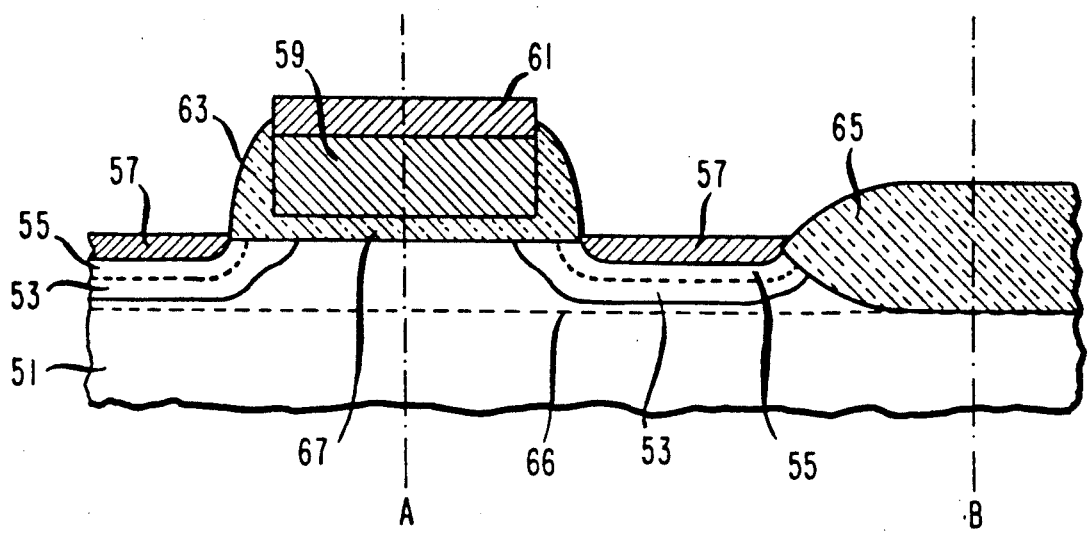

These features will be better understood by referring to FIG. 5 which shows the structure after device fabrication, as well as the adjoining field oxide region. Depicted as substrate 51, lightly doped source/drain regions 53, heavily doped source/drain regions 55, and source/drain silicide contact regions 57. In addition, there is shown polysilicon gate region 59 and gate silicide contact region 61, silicon dioxide gate sidewalls 63, and field oxide 65. As shown, there is a gate oxide 67 under the polysilicon gate 59, with the channel region being located immediately under the gate oxide in the substrate. The approximate depth of the peak concentration of the second boron implant noted above is indicated by dashed line 66. As can be seen, the peak lies just under the field oxide region 65 for improved channel stop isolation. In addition, in the device channel region, the peak of the boron implant helps prevent punch-through between the heavily doped source/drain regions 55.

Figure 6:
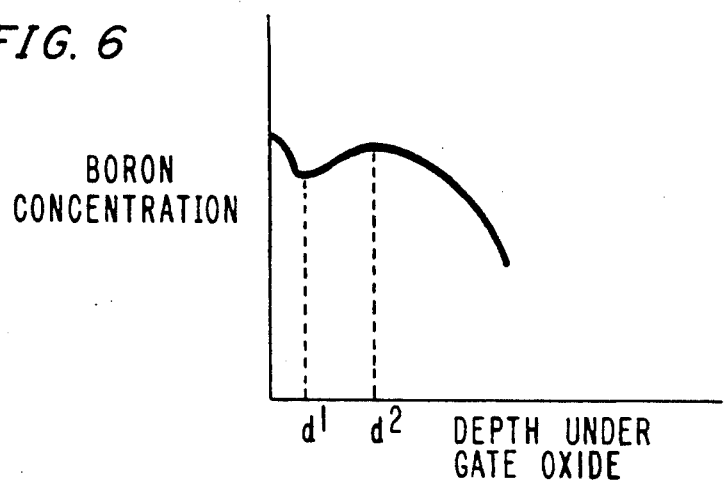
FIG. 6 plots the boron concentration versus the depth in the substrate underneath the gate oxide.
Figure 7:
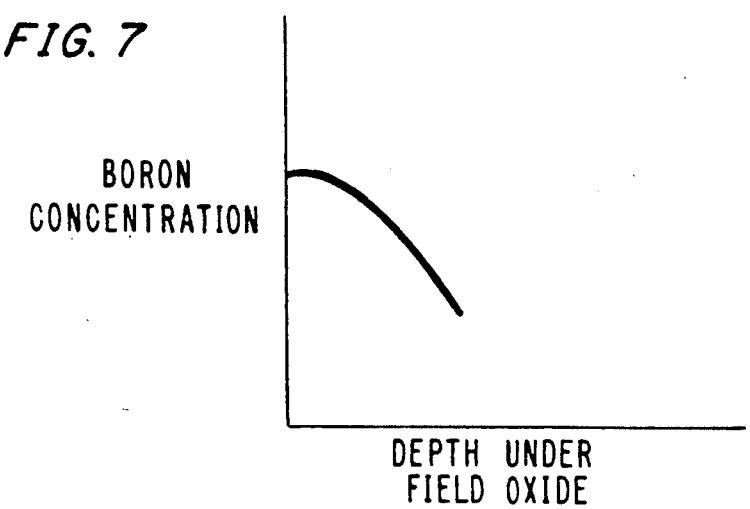
FIG. 7 plots the boron concentration versus in the depth in the substrate underneath the field oxide.

The boron concentration profiles along lines (A) and (B) of FIG. 5, which are through the gate structure and the field oxide, respectively, are shown in FIG. 6 and 7, respectively, with the boron concentration plotted vertically and the depth horizontally. The units for both are arbitrary units. As can be seen in FIG. 6, the boron concentration in the channel region (i.e., directly under the gate oxide) has an initial high value at the surface. This is accomplished by an optional third boron implant, which is referred to as a "threshold adjustment" implant in the art, and is known technique used to raise the threshold voltage of the n-channel device. However, this adjustment is not necessary in all devices, and may alternately be accomplished by other means, such as a p-doped polysilicon gate. In the illustrative embodiment, the threshold adjustment implant is accomplished using $BF_2$ at a beam energy of 50 KeV, at a dose of $1.7 \times 10^{12}/cm^2$. The boron concentration then decreases from this high value at the surface to a minimum at $d^1$, and then increases to the peak at $d^2$ before again decreasing. The peak at $d^2$ is due to the "deep" second boron implant noted above, and the increase between $d^1$ and $d^2$ is the "retrograde" profile referred to herein. Referring to FIG. 7, the boron concentration in the field oxide region has a maximum at the oxide-substrate interface and continually decreases with depth into the substrate.

The depth to which the "deep" boron implant should be accomplished therefore depends on the desired field oxide thickness. In order to determine the implant depth, allowance is made for the greater thickness of silicon dioxide as compared to the silicon consumed in its formation. That is, a given thickness of grown $SiO_2$ consumes about 40 percent as much thickness of the silicon substrate. For example, a field oxide region 65 having a thickness of 630 nanometers (6300 angstroms) consumes about 250 nanometers (2500 angstroms) of the silicon substrate. Such a thickness may be grown at a pressure of 25 atmospheres in steam, at a temperature of 900 degrees centigrade of 25 minutes. Therefore, the boron energy is selected to implant to a depth of slightly greater than 250 nanometers. This may be accomplished using a beam energy of 125 keV when using boron ions. This energy is sufficient to place the peak concentration of the boron at a depth of approximately 300 nanometers (3000 Angstroms) in the substrate. A typical boron dose for this implant is $2.5 \times 10^{12}/cm^2$. Other energies and dosages will be easily selected by those skilled in the art as device design varies and continues to evolve. We estimate that the field oxide thickness as grown will be greater than 450 nanometers (4500 angstroms), thereby consuming at least 180 nanometers (1800 angstroms) of silicon. Hence, the implant depth according to the present technique will typically be at least 200 nanometers, and more typically at least 250 nanometers. However, a reduction in power supply voltage below the current 5 volt standard (e.g., down to perhaps 3 volts) may allow for thinner field oxide regions. Note that the depth referred to is from the silicon surface as implanted, prior to field oxide growth, and remains substantially this same value underneath the gate oxide of the n-channel devices. However, the field oxide is typically subjected to an etch-back procedure to reduce the "birds-beak" effect, so that the field oxide thickness on the final device is typically only about two-thirds of the thicknesses as grown.

Note that the foregoing illustrative embodiment has been given for a twin-tub CMOS process, wherein additional p and n dopants are used to define the two tub regions in a relatively lightly doped substrate (either n-type or p-type). However, the present invention may also be used with a single p-type tub formed in an n-type substrate. That technique is often referred to as a "single well" or "single tub" process, and the n-doped substrate then forms the region in which the p-channel devices are formed. Still other variations are possible.

We claim:

1. a CMOS integrated circuit having p-channel field effect transistors formed in a n-type region, and n-channel field effect transistors formed in a p-type region, wherein a field oxide isolation region overlies a portion of said p-type region adjacent to a source-drain region of a n-channel field effect transistor, and wherein a gate electrode overlies a channel region located between source-drain of said transistor, characterized in that said p-type region of said integrated circuit comprises a p-type impurity threshold adjust implant region extending across said channel region, and still further comprises a p-type impurity channel stop implant region extending under said channel region and said field oxide isolation region throughout said portion of said p-type region that is overlaid by said field oxide isolation region, whereby the concentration of said p-type impurity threshold adjust implant region is at a first maxima at the surface of said p-type region, and the concentration of said p-type impurity channel stop implant region is at a second maxima immediately below said field oxide isolation region overlying said p-type region.

2. An integrated circuit as recited in claim 1, wherein said p-type impurity is boron.

3. An integrated circuit as recited in claim 1 wherein the maximum impurity concentration of said channel stop region is at least 200 nanometers below surface of said silicon body underneath the gate oxide of the n-channel field effect transistors formed in said p-type region.

4. An integrated circuit as recited in claim 1 wherein the maximum impurity concentration of said channel stop region is at least 250 nanometers below the surface of said silicon body underneath the gate oxide of the n-channel field effect transistor formed in said p-type region.

5. The integrated circuit as recited in claim 1 wherein the doping concentration of said p-type impurity as said second maxima is greater than at said first maxima.

* * * * *